(12) United States Patent
Kim et al.

(10) Patent No.: US 12,394,452 B2
(45) Date of Patent: Aug. 19, 2025

(54) ZQ CALIBRATION CIRCUIT FOR MULTIPLE INTERFACES

(71) Applicant: Samsung Electronics Co., Ltd., Suwon-si (KR)

(72) Inventors: Tongsung Kim, Suwon-si (KR); Junghwan Kwak, Suwon-si (KR); Seungjun Bae, Suwon-si (KR); Chiweon Yoon, Suwon-si (KR); Byungkwan Chun, Suwon-si (KR); Youngmin Jo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 59 days.

(21) Appl. No.: 18/464,618

(22) Filed: Sep. 11, 2023

(65) Prior Publication Data
US 2024/0096382 A1   Mar. 21, 2024

(30) Foreign Application Priority Data

Sep. 19, 2022  (KR) .................. 10-2022-0118211
Dec. 6, 2022   (KR) .................. 10-2022-0168967

(51) Int. Cl.
| | |
|---|---|
| *H03K 19/00* | (2006.01) |
| *G06F 13/16* | (2006.01) |
| *G11C 7/10* | (2006.01) |
| *H04L 25/02* | (2006.01) |

(52) U.S. Cl.
CPC ............ *G11C 7/1048* (2013.01); *G06F 13/16* (2013.01); *G06F 2213/16* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 6,734,702 B1 * | 5/2004 | Ikeoku | .............. H04L 25/0272 327/108 |
| 10,090,064 B2 | 10/2018 | Pan | |
| 10,193,711 B2 | 1/2019 | Wieduwilt et al. | |
| 10,255,969 B2 | 4/2019 | Eom et al. | |

(Continued)

OTHER PUBLICATIONS

Extended European Search Report dated Feb. 1, 2024 issued in the corresponding European Patent Application No. 23198288.5-1224.

*Primary Examiner* — Anh Q Tran
(74) *Attorney, Agent, or Firm* — Harness, Dickey & Pierce, P.L.C.

(57) ABSTRACT

A ZQ calibration circuit includes: a ZQ controller configured to detect an end of one interface mode, among a plurality of interface modes in which ZQ calibration is supported, and to instruct a switch to another interface mode in response to the one interface mode coming to an end; a ZQ engine configured to generate a first reference voltage corresponding to the one interface mode through a multi-reference voltage generator, to generate a second reference voltage corresponding to the another interface mode in response to the switch to the another interface mode being instructed, to perform the ZQ calibration based on the first reference voltage or the second reference voltage, and to output a calibration code; and a ZQ driver configured to output an output signal through an input/output pad based on the calibration code.

20 Claims, 9 Drawing Sheets

(56) References Cited

U.S. PATENT DOCUMENTS

| | | |
|---|---|---|
| 10,891,989 B2 | 1/2021 | Satoh et al. |
| 11,194,488 B2 | 12/2021 | Koizumi |
| 11,217,283 B2 | 1/2022 | Lee et al. |
| 11,296,698 B2 | 4/2022 | Michioka |
| 2017/0154668 A1 | 6/2017 | Ha |
| 2017/0287535 A1 | 10/2017 | Lee et al. |
| 2019/0080745 A1* | 3/2019 | Kim ...................... G11C 7/1057 |
| 2019/0259429 A1 | 8/2019 | Heo et al. |
| 2022/0335989 A1* | 10/2022 | An ....................... G11C 29/022 |

* cited by examiner

CTT Interface

LTT Interface

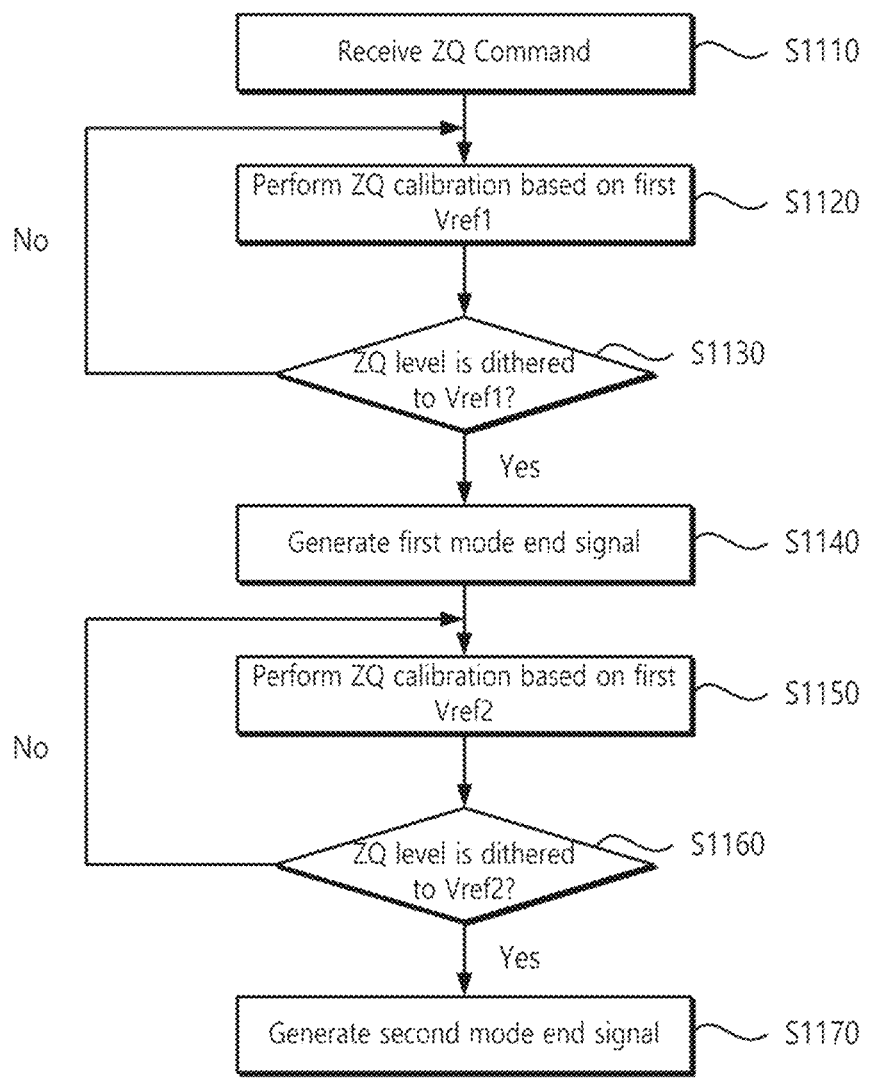

ZQ CALIBRATION CIRCUIT FOR MULTIPLE INTERFACES

CROSS-REFERENCE TO RELATED APPLICATIONS

This application claims benefit of priority to Korean Patent Application Nos. 10-2022-0118211, filed on Sep. 19, 2022, and 10-2022-0168967, filed on Dec. 6, 2022, in the Korean Intellectual Property Office, the disclosures of each of which are incorporated herein by reference in their entirety.

BACKGROUND

Various example embodiments relate to an input/output impedance matching, or ZQ calibration circuit for multiple interfaces.

There is increasing demand for high performance (high speed, high power efficiency, and/or the like) of a memory device. To this end, interfaces of various modes for supporting a higher input/output speed have been supported in some specifications. However, only a ZQ calibration feature for a single interface is currently supported. Accordingly, when ZQ calibration is performed on interfaces of various modes, a command for the ZQ calibration and a ZQ calibration time increase by the number of interfaces.

SUMMARY

Example embodiments provide a ZQ calibration circuit for providing a ZQ calibration feature in multiple interfaces.

According to various example embodiments, a ZQ calibration circuit includes a ZQ controller configured to detect an end of one interface mode, among a plurality of interface modes in which ZQ calibration is supported, and to instruct a switch to another interface mode in response to the one interface mode coming to an end; a ZQ engine configured to generate a first reference voltage corresponding to the one interface mode through a multi-reference voltage generator, to generate a second reference voltage corresponding to the another interface mode when the switch to the another interface mode is instructed, to perform the ZQ calibration based on the first reference voltage or the second reference voltage, and to output a calibration code; and a ZQ driver configured to output an output signal through an input/output pad based on the calibration code.

Alternatively or additionally according to various example embodiments, a ZQ calibration method of a ZQ calibration circuit may include performing ZQ calibration based on a first reference voltage in one interface mode, among a plurality of interface modes in which the ZQ calibration is supported; detecting an end of the one interface mode; instructing a switch to another interface mode when the one interface mode comes to an end; generating a second reference voltage corresponding to the another interface mode when the switch to the another interface mode is instructed; performing the ZQ calibration based on the second reference voltage and outputting a calibration code; and outputting an output signal through an input/output pad based on the calibration code.

Alternatively or additionally according to various example embodiments, a memory device includes: a memory controller; a buffer chip operating configured to be under control of the memory controller; and a nonvolatile memory connected to the buffer chip. The memory controller, the buffer chip, and the nonvolatile memory may be configured to operate in a plurality of interface modes in which ZQ calibration is supported. The memory device may be configured to operate such that the ZQ calibration is performed based on a first reference voltage in one interface mode, among the plurality of interface modes, and may include instructing a switch to another interface mode in response to the one interface mode comes to an end, generating a second reference voltage corresponding to the another interface mode in response to the switch to the another interface being instructed, performing the ZQ calibration based on the second reference voltage, outputting a calibration code, and outputting an output signal through an input/output pad based on the calibration code.

BRIEF DESCRIPTION OF DRAWINGS

The above and other aspects, features, and advantages of various example embodiments will be more clearly understood from the following detailed description, taken in conjunction with the accompanying drawings.

FIG. 12 is a flowchart illustrating a method of operating a memory device according to various example embodiments.

DETAILED DESCRIPTION

Hereinafter, some example embodiments will be described with reference to the accompanying drawings.

Hereinafter, various example embodiments of a ZQ calibration circuit, which may be employed in a memory device supporting various interface modes, will be described.

Figure 1:
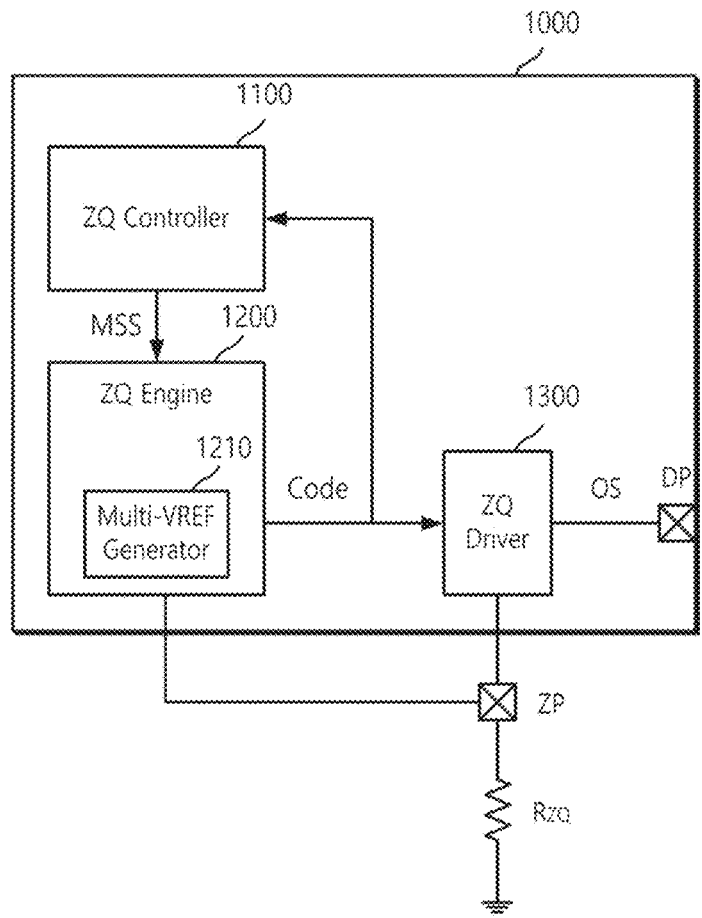
FIG. 1 is a diagram illustrating a ZQ calibration circuit according to various example embodiments.

FIG. 1 is a diagram illustrating a ZQ calibration circuit according to various example embodiments.

Referring to FIG. 1, a ZQ calibration circuit 1000 may support a ZQ calibration feature, and may include a ZQ controller 1100, a ZQ engine 1200, and a ZQ driver 1300.

A ZQ pad ZP for ZQ calibration may be connected to the ZQ calibration circuit 1000, and a ZQ resistor RZQ may be connected to the ZQ pad ZP. The ZQ resistor RZQ may be or may include an external resistor connected to an outside of a chip of a memory device. For example, a resistance of the ZQ resistor RZQ may be 240 ohms, but example embodiments are not limited thereto. The ZQ resistor may have one end that is connected to the ZQ pad ZP, and another end connected to ground.

The ZQ calibration circuit 1000 may support a ZQ calibration feature with respect to the ZQ resistor RZQ. Now, the ZQ calibration feature supported by the ZQ calibration circuit 1000 will be described. Memory devices may output a signal to a channel through an output pad and may receive a signal transmitted from the channel through an input pad. At least a portion of the signals, transmitted and received through the channel, may be reflected at a receiving end (hereinafter referred to as a "reflected signal"), and such a reflected signal may operate as noise of an original signal. Thus, signal integrity may be deteriorated. A swing width of a signal may be reduced to significantly reduce transmission time of a signal transmitted and received between memory devices. However, in general the smaller the swing width, the more vulnerability to the noise.

In addition, an influence of the reflected signal may be increased with the presence of impedance mismatching between the transmitting end and the receiving end. The impedance mismatching may occur due to one or more variations in one or more of a process, a voltage, and a temperature (PVT).

Termination resistance may be employed to remove or help remove such a reflected signal and secure signal integrity. The termination resistance may match impedance between a transmitting end and a receiving end of a memory device. In a case of a memory device requiring or using a significantly high speed operation speed, on-die-termination (ODT) technology, in which termination resistance is employed on a die of a memory device, may be applied to block a reflected signal and signal interference between memory devices.

As used herein, ZQ calibration refers to a process of correcting such termination resistance to appropriately or more successfully perform impedance matching. In the ZQ calibration, pull-up and/or pull-down calibration codes that vary depending on PVT as described above, may be generated and termination resistance may be adjusted based on the generated pull-up and/or pull-down calibration codes so as to perform impedance matching between memory devices transmitting and receiving signals.

For example, the ZQ calibration circuit 1000 may detect a mode change between a plurality of interface modes, in which ZQ calibration is supported, and may support a ZQ calibration feature based on the detected mode.

As described herein, an interface mode may refer to a mode in which a ZQ calibration feature is supported through various interfaces provided between different integrated circuits (ICs) or chips. When a plurality of interface modes are supported, an output signal OS on the transmitting end, outputting a signal from an IC or a chip through different interfaces, is pulled up and pulled down in different interface modes. Accordingly, the output signal OS may be output to have a signal swing, varying depending on respective interface modes, through the pull-up and pull-down transistors. The interface mode may support the ZQ calibration feature between the transmitting end and the receiving end by receiving the output signal OS through the pull-up and pull-down transistors. Example embodiments of the interface mode will be described later.

Hereinafter, the elements of the ZQ calibration circuit 1000 will be described in detail.

The ZQ controller 1100 may control up to the overall operation of the ZQ calibration circuit 1000.

In various example embodiments, the ZQ controller 1100 may detect an end of a single interface mode, among a plurality of interface modes in which the ZQ calibration is supported, and may instruct a mode switch to another interface mode when or in response to the single interface mode coming to an end.

The single interface mode may refer to an interface mode in which the ZQ calibration circuit 1000 is currently operating. The ZQ calibration circuit 1000 may perform ZQ calibration when the ZQ calibration is enabled based on a ZQ command, and may first perform the ZQ calibration in a predetermined single interface mode. When ZQ calibration is completed in a single interface mode, for example, when the interface mode comes to an end or is completed, the ZQ controller 1100 may detect the ending or completion of the interface mode.

The ZQ controller 1100 may instruct the ZQ engine 1200 to switch to another interface mode when detecting the end or completion of the first interface mode. For example, the ZQ controller 1100 may transmit a mode switch signal MSS to the ZQ engine 1200. The mode switch signal MSS may include information on a reference voltage for each interface mode.

The ZQ engine 1200 may perform ZQ calibration and may generate a calibration code Code. The ZQ engine 1200 may include a multi-reference voltage generator 1210 generating a reference voltage having various values depending on an interface mode.

The multi-reference voltage generator 1210 may generate a reference voltage generated for each interface mode. For example, the multi-reference voltage generator 1210 may generate a first reference voltage corresponding to a predetermined single interface mode when the ZQ calibration is enabled. Then, when mode switch is instructed from the ZQ controller 1100 (for example, through the mode switch signal MSS, or the like), the multi-reference voltage generator 1210 may generate a second reference voltage corresponding to another interface mode.

The ZQ engine 1200 may perform ZQ calibration based on the first reference voltage or the second reference voltage generated from the multi-reference voltage generator 1210, and may output a calibration code Code.

The ZQ engine 1200 may compare the first reference voltage or the second reference voltage with a ZQ voltage, a voltage of the ZQ pad ZP, and may generate and output a calibration code Code based on a result of the comparison. The calibration code may include a pull-up calibration code Code and/or a pull-down calibration code Code, that are based on a result obtained by comparing the reference voltage with the ZQ voltage. The ZQ engine 1200 may output the calibration code Code to the ZQ engine 1200 or the ZQ controller 1100. The ZQ controller 1100 may receive and store the calibration code Code. The calibration code Code may be generated for each interface mode.

The ZQ driver 1300 may output an output signal OS through the input/output pad DP based on the calibration code Code output from the ZQ engine 1200. The ZQ driver 1300 may adjust the terminating resistance based on the calibration code Code. The output signal OS, output from the ZQ driver 1300, may have a signal level based on the adjusted terminating resistance. For example, the output signal OS may have different signal levels for each interface mode. This may be because the reference voltage used to output the calibration code is different for each interface mode, as described above.

The ZQ calibration according to various example embodiments may be performed on all of a plurality of interface modes during a single ZQ command and within a single unit ZQ time corresponding to the single ZQ command. For example, the ZQ engine 1200 may performs ZQ calibration for a single interface mode in response to the single ZQ command, and may similarly perform ZQ calibration for another interface mode in response to the same ZQ command when mode switch is instructed from the ZQ controller 1100. For ease of description, the description has been provided with respect to two interface modes, but ZQ calibration may be similarly performed during a single ZQ command and a single unit ZQ interval even when three or more interface modes are employed.

As described above, the ZQ calibration circuit 1000 according to various example embodiments may support a ZQ calibration feature for various interface modes. For example, when ZQ calibration for a single interface mode comes to an end or finishes, a mode switch such as a change in reference voltage for ZQ calibration of another interface mode may be instructed by detecting the end of or the completion of the interface mode, rather than assigning an additional ZQ command and/or allocating an additional ZQ time. Accordingly, ZQ calibration for all interface modes may be performed during a single ZQ command and a single unit ZQ time without issuing a ZQ command for each of a plurality of interface modes. There may be an improvement in performance of the memory device.

Figure 2:
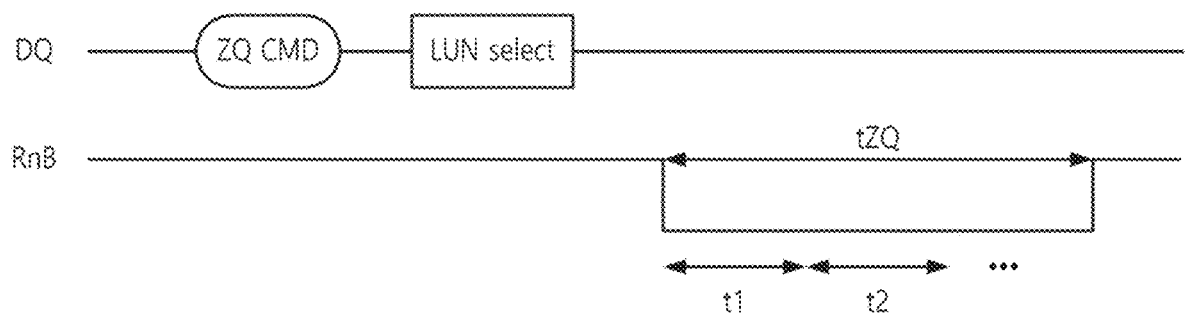
FIG. 2 is a diagram illustrating an operation sequence of the ZQ calibration circuit of FIG. 1.

FIG. 2 is a diagram illustrating an operation sequence of the ZQ calibration circuit of FIG. 1.

Referring to FIG. 2, a ZQ command ZQ CMD for ZQ calibration may be issued. The ZQ command ZQ CMD may be issued as a data signal (or an input/output signal OS) (hereinafter referred to as a "DQ signal").

In various example embodiments, ZQ calibration may include initial ZQ calibration (hereinafter referred to as "ZQ long calibration") and runtime ZQ calibration (hereinafter referred to as "ZQ short calibration"). The ZQ long calibration may be performed for a relatively long time (for example, for one us or less), and ZQ short calibration may be performed for a relatively short time, which may be shorter than the ZQ long calibration time (for example, for 0.3 us or less).

For example, different ZQ commands ZQ CMD may be issued for the ZQ long calibration and the ZQ short calibration, respectively. A logic unit number (LUN) may be selected, wherein the LUN is a unit in which an independent command may be applied and an operation may be performed. When a reset command is issued during ZQ calibration, the ZQ calibration may be performed again. Before the runtime ZQ calibration is performed, initial ZQ calibration may be successfully completed or come to an end without being interrupted by reset.

When the LUN is selected, the ZQ calibration circuit 1000 may perform ZQ calibration for the selected LUN. The ZQ calibration may be performed during a ZQ time tZQ indicated by a RnB signal representing a current state of a ZQ calibration operation. The ZQ time tZQ may also be referred to as "training time" and may be set to be different depending on ZQ long calibration (for example, 1 us) or ZQ short calibration (for example, 0.3 us), as described above.

The ZQ calibration circuit 1000 according to various example embodiments may perform ZQ calibration for all of a plurality of interface modes within the ZQ time tZQ. For example, the ZQ calibration circuit 1000 may perform ZQ calibration for each interface mode for a time subsequent to t1, t2, and t3 assigned for each interface mode within the ZQ time tZQ. For example, the ZQ calibration circuit 1000 may detect the end of or the completion of a single interface mode (for example, a time corresponding to t1) and may instruct a mode switch to another interface mode (for example, a time corresponding to t2). In this case, the ZQ engine 1200 may generate a second reference voltage during the time t2 when mode switch is instructed while generating a first reference voltage during the time t1.

Accordingly, ZQ calibration for a plurality of interface modes may be performed during a single ZQ command ZQ CMD and within a single unit ZQ time tZQ, as illustrated in FIG. 2.

Figure 3A:
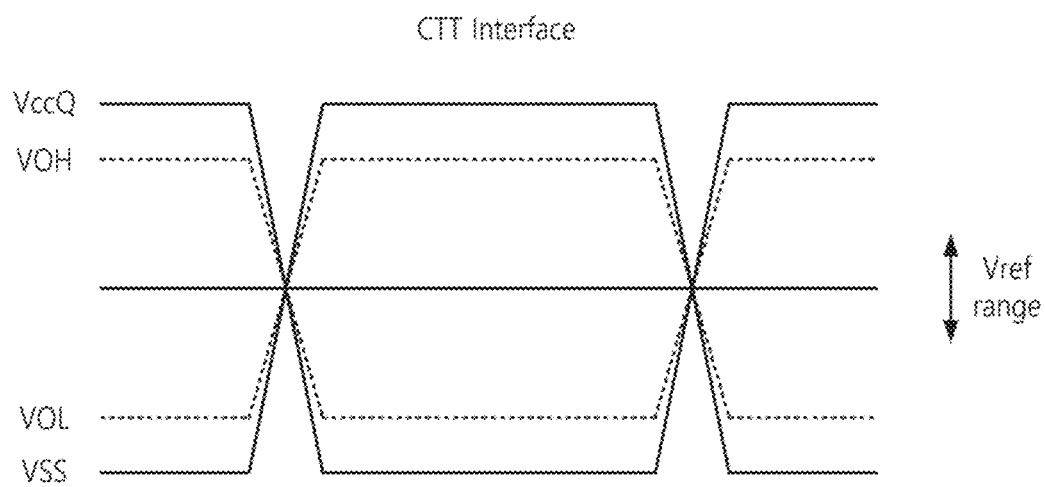
FIGS. 3A and 3B are diagrams illustrating exemplary interface modes of operation to which a ZQ calibration circuit according to example embodiments may be applied.
Figure 3B:
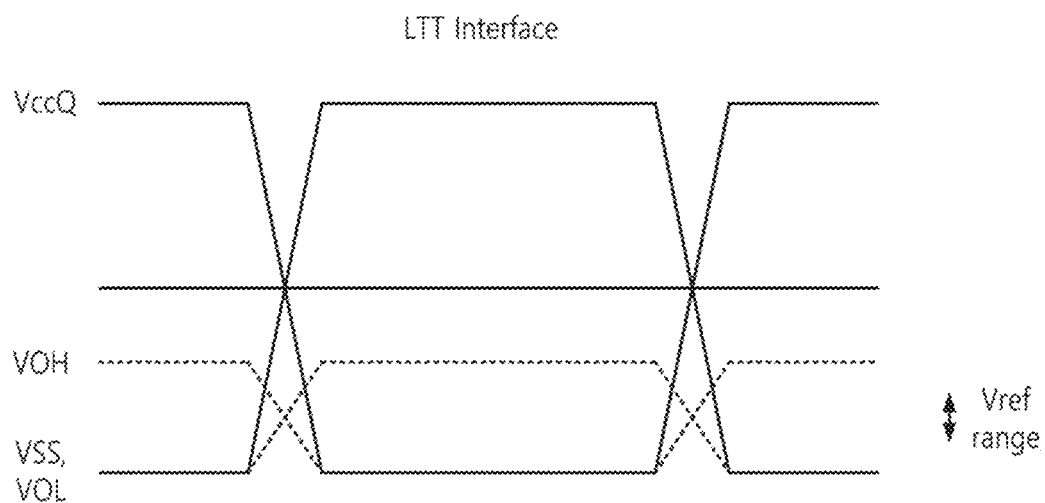

FIGS. 3A and 3B are diagrams illustrating exemplary interface modes of operation to which a ZQ calibration circuit according to various example embodiments may be applied.

As describe above, the calibration circuit 1000 according to various example embodiments may be applied to all interface modes in which a ZQ calibration feature can be applied, and FIGS. 3A and 3B are merely examples without limitation.

For example, an interface supporting a plurality of interface modes may include a center tapped termination (CTT) interface and a low tapped termination (LTT) interface.

Referring to FIG. 3A, in the CTR interface, an output of the CTT interface may have signal swing of half of an input/output voltage (hereinafter referred to as VccQ) as a center, for example, a common level. Accordingly, the CTT interface may have high resistance to VccQ noise and to ground noise. The CTT interface may have an advantage of noise margin under, for example, a heavy power load or a noise system.

A reference voltage for a CTT interface operation may be defined as a voltage within a predetermined range at half of VccQ.

Referring to FIG. 3B, in the LTT interface, an output of the LTT interface may have signal swing from a ground voltage VSS to VOH, which is an output voltage corresponding to logic '1.' A swing range may be automatically calibrated through a NAND controller or a low-power operation. Since channel power is reduced to be equal to or lower than VOH (for example, VOL, an output voltage corresponding to logic '0' is grounded), the LTT interface may be appropriate to a light load system. An output voltage corresponding to logic '1' of the output of the LTT interface may be set to various voltages divided from VccQ.

A ground voltage for an LTT interface operation may be defined as a voltage within a predetermined range between the ground voltage VSS and half of VOH.

Each interface output illustrated in FIGS. 3A and 3B may correspond to an output of the ZQ driver 1300 when the ZQ calibration circuit 1000 is employed or used.

In some example embodiments, in the case in which the calibration circuit 1000 operates in a CTT interface mode when ZQ calibration is enabled, a first reference voltage may be a reference voltage of the CTT interface mode. In this case, the ZQ calibration circuit 1000 may perform ZQ calibration until a common level of swing of the output signal OS of the ZQ driver 1300 corresponds to half of an input/output voltage as illustrated in FIG. 3B.

When the ZQ calibration is completed and a first interface mode comes to an end, the ZQ calibration circuit 1000 may detect the end of or the completion of the first interface mode. Then, the ZQ calibration circuit 1000 may instruct mode switch and may perform ZQ calibration using a reference voltage of the LTT interface mode, a switched mode, as a second reference voltage. The ZQ calibration circuit 1000 may perform ZQ calibration until or based upon a minimum point of the swing of the output signal OS of the ZQ driver corresponding to the ground voltage.

According to some example embodiments, when the ZQ calibration circuit 1000 operates in a single interface mode (for example, the CTT interface mode) for noise margin and then operates in another interface mode (for example, the LTT interface mode) for power saving, a ZQ calibration for the two interface modes may be performed through a single ZQ command ZQ CMD and within a unit ZQ time tZQ.

Alternatively, in contrast, the LTT interface mode and the CTT interface mode may be sequentially performed.

The CTT interface mode and the LTT interface mode described above are merely examples, and the ZQ calibration according to various example embodiments may be performed in a dual interface mode, in which various other interface modes are combined, or a plurality of interface modes.

Figure 4:
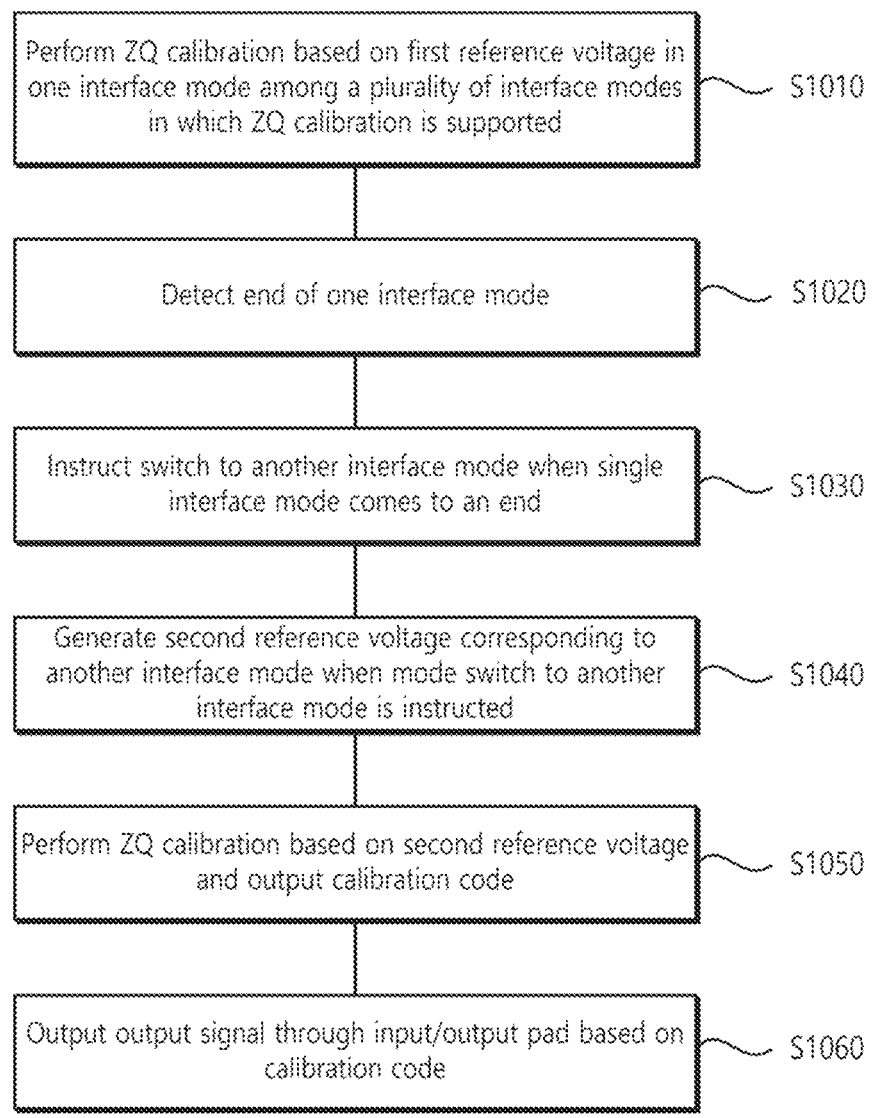
FIG. 4 is a flowchart illustrating a ZQ calibration method according to various example embodiments.

FIG. 4 is a flowchart illustrating a ZQ calibration method according to various example embodiments.

Referring to FIG. 4, in various example embodiments, in operation S1010, the ZQ calibration circuit 1000 may perform ZQ calibration based on a first reference voltage in one interface mode, among a plurality of interface modes in which ZQ calibration is supported. A calibration code Code may be output through ZQ calibration, and the ZQ calibration circuit 1000 may perform ZQ calibration in the one interface mode based on to the corresponding calibration code Code.

In operation S1020, the ZQ calibration circuit 1000 may detect the end of the one interface mode.

In operation S1030, the ZQ calibration circuit 1000 may instruct a mode switch to another interface mode when the one interface mode comes to an end.

In operation S1040, the ZQ calibration circuit 1000 may generate a second reference voltage corresponding to another interface mode when the mode switch to another interface mode is instructed.

In operation S1050, the ZQ calibration circuit 1000 may perform ZQ calibration based on the second reference voltage and may output a calibration code Code. The output calibration code Code may be generated in another interface mode.

In operation S1060, the ZQ calibration circuit 1000 may output an output signal OS through the input/output pad DP based on the calibration code Code. In this case, the output signal OS may have the second reference voltage, corresponding to another interface mode, at a common level.

Figure 5:
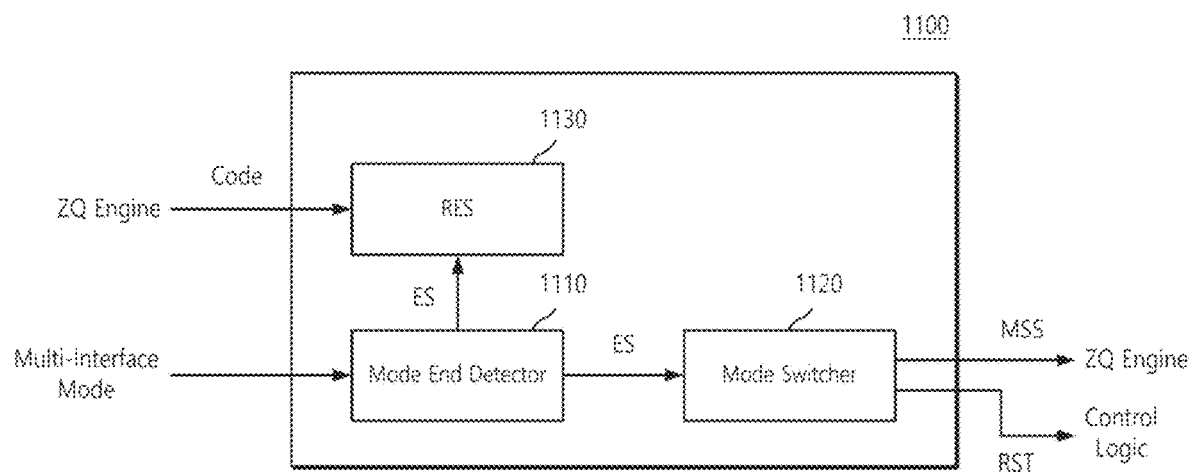
FIG. 5 is a diagram illustrating a ZQ controller according to various example embodiments.

FIG. 5 is a diagram illustrating a ZQ controller according to various example embodiments.

Referring to FIG. 5, a ZQ controller 1100 according to various example embodiments may include a mode end detector 1110, a mode switcher 1120, and a register 1130.

The mode end detector 1110 may detect an end of or a completion of a currently operating interface mode, among a plurality of interface modes, and may output a mode end signal ES.

In various example embodiments, the mode end detector 1110 may output the mode end signal ES when an output signal OS of the ZQ driver 1300 swings, for example, dithers within a range (such as a dynamically determined, or, alternatively, predetermined range) with respect to a first reference voltage or a second reference voltage. For example, the mode end detector 1110 may monitor an output of the ZQ driver 1300 to detect the end of the interface mode.

In various example embodiments, the mode end detector 1110 may detect the of the interface mode based on a ZQ clock signal for an operation of the ZQ calibration circuit 1000. A number of pulses, such as a dynamically determined or predetermined number of pulses included in the ZQ clock signal, may be assigned for each interface mode. In this case, the mode end detector 1110 may detect the end of the interface mode based on the number of pulses corresponding to a single interface mode.

The mode end detector 1110 may detect the end of the interface mode through various methods, other than or in addition to variously described example embodiments. The mode end signal ES generated by the detection may be transmitted to the mode switcher 1120 or the register 1130. Alternatively or additionally, the mode end signal ES may be generated for each of the different interface modes.

The mode switcher 1120 may output a mode switch signal MSS to the ZQ engine 1200 when receiving the mode end signal ES. The mode switch signal MSS may include information on a reference voltage of the switched interface mode.

In various example embodiments, the mode switcher 1120 may output a mode switch signal MSS to the ZQ engine 1200 when receiving the mode end signal ES.

Also, the mode switcher 1120 may generate a reset signal RST to reset various control logics for ZQ calibration. The term "control logic" may refer to a component included in the ZQ calibration circuit 1000 or provided for a ZQ calibration feature to control the overall operation of the ZQ calibration. The control logic may be implemented in various forms of hardware and/or software and/or firmware.

For example, the reset signal RST may reset at least a portion of the operation of the ZQ controller 1100 and the operation of the ZQ engine 1200. The reset signal RST may reset the control logic in a state in which the ZQ enable signal for operating the ZQ engine 1200 is maintained. For example, the reset signal RST may perform a reset operation without disabling the ZQ calibration.

The register 1130 may store the mode end signal ES, received from the mode end detector 1110, and a calibration code Code received from the ZQ engine 1200.

In various example embodiments, the register 1130 may store a calibration code Code corresponding to a time point at which the mode end signal ES is output. For example, the register 1130 may store a calibration code Code corresponding to a time point at which a mode end signal ES generated when an end of one interface mode is detected (hereinafter referred to as a "first mode end signal") is output, and may store calibration codes corresponding to a time point at which the mode end signal ES generated when an end of another interface mode is detected (hereinafter referred to as a "second mode end signal") is output.

In various example embodiments, the register 1130 may store a calibration code Code corresponding to a time point at which the ZQ enable signal for operating the ZQ engine 1200 comes to an end. For example, the register 1130 may store a calibration code Code at a time point at which the ZQ time tZQ, illustrated in FIG. 2, comes to an end. In some example embodiments, the register 1130 may store only a calibration code generated in a last interface mode within the ZQ time tZQ according to various example embodiments.

Figure 6:
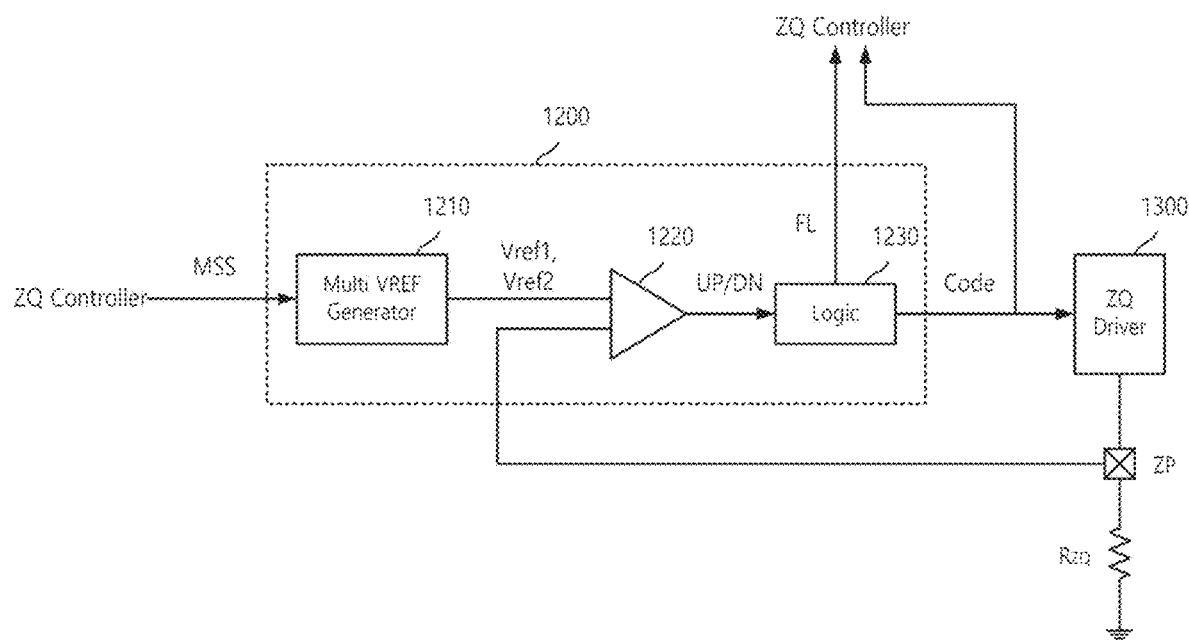
FIG. 6 is a diagram illustrating a ZQ engine and a ZQ driver according to various example embodiments.

FIG. 6 is a diagram illustrating a ZQ engine and ZQ driver according to various example embodiments.

Referring to FIG. 6, the ZQ engine 1200 according to various example embodiments may include a multi-reference voltage generator 1210, a comparator 1220, and a logic 1230.

The multi-reference voltage generator 1210 may generate a first reference voltage Vref1 corresponding to one interface mode when ZQ calibration is enabled, and may output the generated first reference voltage Vref1 to the comparator 1220. Then, the multi-reference voltage generator 1210 may generate a second reference voltage Vref2 corresponding to another interface mode and output the generated second reference voltage Vref2 to the comparator 1220 when receiving the mode switch signal MSS from the ZQ controller 1100. Also, the multi-reference voltage generator 1210 may generate reference voltages having various values according to various interfaces.

The comparator 1220 may have an input terminal connected to the multi-reference voltage generator 1210 and a ZQ pad ZP to which a ZQ resistor RZQ is connected. The comparator 1220 may compare a reference voltage with a ZQ voltage, e.g., a voltage of the ZQ pad ZP, and may generate an up/down signal UP/DN based on a result of the comparison. The ZQ voltage may be or may correspond to a divided voltage of the ZQ driver 1300 and the ZQ resistor RZQ. The ZQ driver 1300 may include at least one pull-up circuit and at least one pull-down circuit according to various embodiments. For example, when one of the at least one pull-up circuit is connected to the ZQ pad ZP, the ZQ voltage may be a divided voltage of a single pull-up circuit and the ZQ resistor RZQ.

The logic 1230 may output the calibration code Code to the ZQ driver 1300 based on the result of the comparison.

In various example embodiments, the logic 1230 may be a counter. The logic 1230 may generate a binary calibration code Code based on the up/down signal. The binary code may include a pull-up calibration code Code and a pull-down calibration code Code. The logic 1230 may output the generated calibration code to the ZQ driver 1300. The ZQ driver 1300 may receive the pull-up calibration code Code or the pull-down calibration code Code from the counter, and impedance may be adjusted based on a corresponding code. For example, at least one pull-up circuit included in the ZQ circuit may be adjusted based on the pull-up calibration code Code, and at least one pull-down circuit included in the ZQ circuit may be adjusted based on the pull-down calibration code Code.

In various example embodiments, the pull-up/pull-down calibration codes generated through the logic 1230 may be transmitted to a memory device, performing ZQ calibration, and another memory device transmitting and receiving a signal. Similarly, the memory device transmitting and receiving a signal may perform ZQ calibration based on the received pull-up/pull-down calibration codes. According to various example embodiments, the memory device receiving the pull-up/pull-down calibration codes may perform ZQ calibration based on ODT, and/or may perform ZQ calibration based on adjustment of driver strengths DS. An operation of adjusting the driver strengths DS may have an equivalent effect the ZQ calibration. For example, the memory device receiving the pull-up/pull-down calibration codes may perform ZQ calibration through adjustment of driver strengths without including components such as a calibration circuit or an ODT circuit.

The logic 1230 may transmit the generated pull-up/pull-down calibration codes Code to the ZQ controller 1100. The register 1130 included in the ZQ controller 1100 may store a calibration code. For example, the logic 1230 may store the pull-up/pull-down calibration codes Code when signal swing of the output signal OS of the ZQ driver 1300 through ZQ calibration reaches a target swing range.

In various example embodiments, the logic 1230 may generate and output a flag signal FL to the ZQ controller 1100 when ZQ calibration through the pull-up/pull-down calibration code Code is completed. For example, the logic 1230 may generate the flag signal FL when the ZQ calibration is successfully performed and one interface mode or another interface mode comes to an end. Alternatively or additionally, the logic 1230 may transmit the calibration code Code at the time of the end to the ZQ controller 1100.

The ZQ controller 1100 receiving the generated flag signal FL may detect the end of the interface mode through, for example, the mode end detector 1110.

Figure 7:
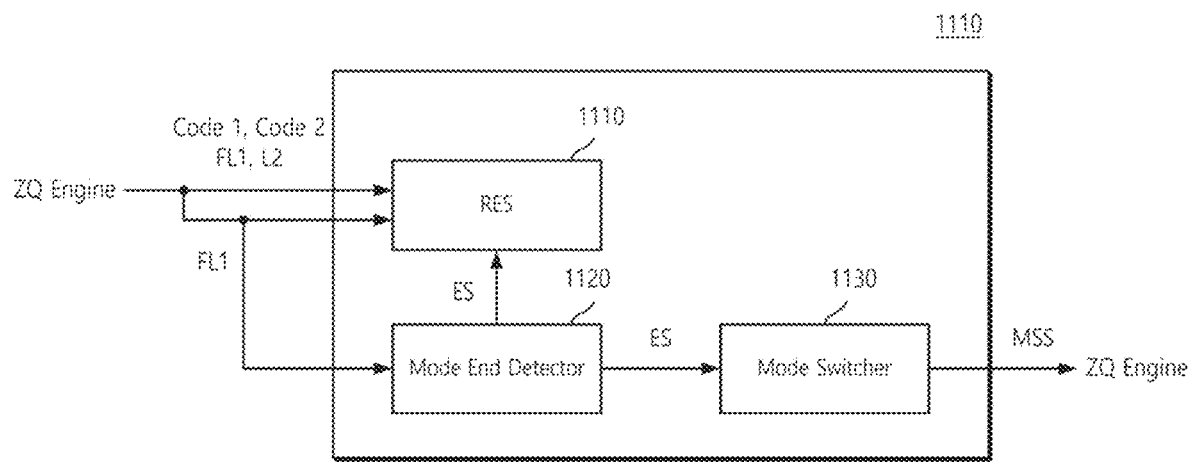
FIG. 7 is a diagram illustrating a ZQ controller according to various example embodiments.

FIG. 7 is a diagram illustrating a ZQ controller according to various example embodiments.

Referring to FIG. 7, in various example embodiments, the ZQ controller 1100 may receive the flag signal FL described above in FIG. 6. The flag signal FL may include a first flag signal FL1, generated when one interface mode comes to an end, and a second flag signal FL2 generated when another interface mode comes to an end.

When the mode end detector 1110 receives the first flag signal FL1 from the ZQ engine 1200, the mode end detector 1110 may detect that one interface mode has come to an end. The mode end detector 1110 may detect the end of one interface mode based on the first flag signal FL1 and may output the mode end signal ES to the mode switcher 1120. The mode switcher 1120 may output the mode switch signal MSS to the ZQ engine 1200.

In some example embodiments, the register 1130 may receive and/or store the first flag signal FL1 and the second flag signal FL2 from the ZQ engine 1200.

In some example embodiments, the register 1130 may receive and/or store a first calibration code Code1 and a second calibration code Code2, respectively corresponding to the interface modes, from the ZQ engine 1200.

Figure 8:
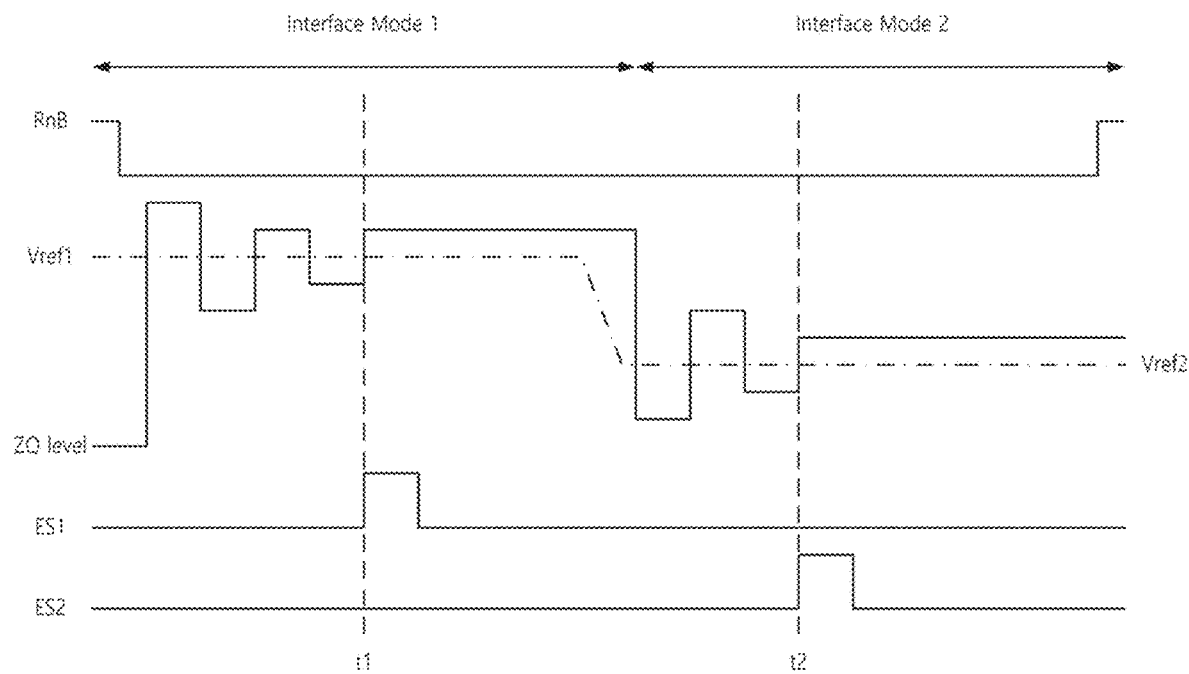
FIG. 8 is an operation waveform diagram of a ZQ calibration circuit according to various example embodiments.

FIG. 8 is an operation waveform diagram of a ZQ calibration circuit according to various example embodiments.

Referring to FIG. 8, when ZQ calibration is enabled, the ZQ calibration feature may be performed during a ZQ time tZQ indicated by an RnB signal representing a current state of operation. As an example, FIG. 8 illustrates a case in which a first reference voltage Vref1 corresponding to a first interface mode is higher than (greater than) a second reference voltage Vref2 corresponding to a second interface mode, but example embodiments are not limited thereto.

The ZQ calibration circuit 1000 may perform ZQ calibration according to the first interface mode. An output signal OS of the ZQ driver 1300 may have repeated levels corresponding to logic '1' and logic '0' with respect to the first reference voltage Vref1 through ZQ calibration at an initial level. The ZQ calibration may be performed until the output signal OS of the ZQ driver 1300 swings within a predetermined range with respect to the first reference voltage Vref1.

When the ZQ calibration is completed and the swing of the output signal OS is dithered, the ZQ calibration circuit 1000 may detect the end of or the completion of the first interface mode and may generate a first mode end signal ES1. In various example embodiments, the end of or the completion of the first interface mode may be detected through a first flag signal FL1. In this case, the ZQ calibration circuit 1000 may store a calibration code Code at a first timing t1 at which the first mode end signal ES1 is generated.

According to the first mode end signal ES1, the interface mode may switch from the first interface mode to the second interface mode. Accordingly, the reference voltage may also change from the first reference voltage Vref1 to a second reference voltage Vref2. The ZQ calibration circuit 1000 may perform ZQ calibration based on the changed second reference voltage Vref2. The ZQ calibration may be performed until the output signal OS of the ZQ driver 1300 swings within a particular (or predetermined) range with respect to the second reference voltage Vref2.

When the ZQ calibration is completed and the swing of the output signal OS is dithered, the ZQ calibration circuit 1000 may detect the end of the second interface mode and may generate a second mode end signal ES2. As an example, the end of the second interface mode may be detected through a second flag signal FL2. In this case, the ZQ calibration circuit 1000 may store the calibration code Code at a second timing t2 at which the second mode end signal ES2 is generated.

In FIG. 8, the description has been provided with respect to two interface modes, ZQ calibration may be performed according to three or more interface modes. In this case, the second mode end signal ES may trigger a switch to an interface mode to operate after the second interface mode.

Figure 9:
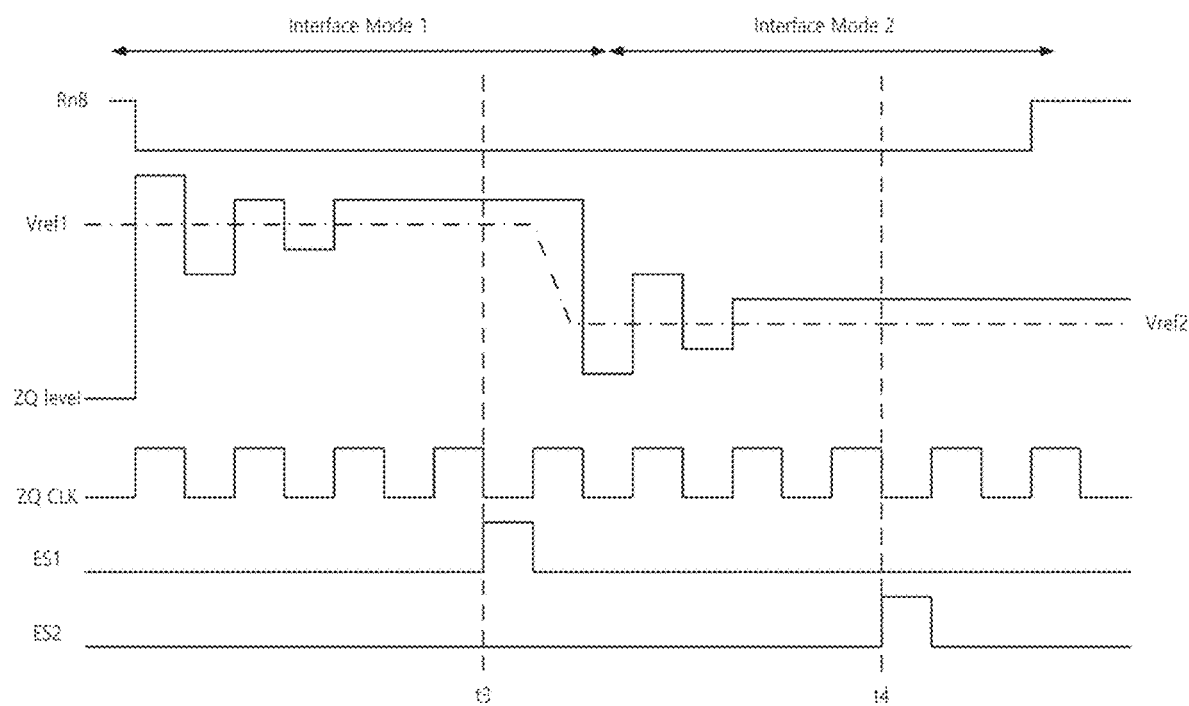
FIG. 9 is an operation waveform diagram of a ZQ calibration circuit according to various example embodiments.

FIG. 9 is an operation waveform diagram of a ZQ calibration circuit according to various example embodiments.

Referring to FIG. 9, the ZQ calibration circuit 1000 according to an embodiment may detect an end of an interface mode based on a ZQ clock signal for an operation of the ZQ calibration circuit 1000.

For example, a predetermined number of pulses included in the ZQ clock signal may be assigned to each of the first interface mode and the second interface mode. When the number of ZQ clock signals assigned to the first interface mode is identified (a time point t3), the ZQ calibration circuit 1000 may generate a first mode end signal ES1. Then, when the number of ZQ clock signals assigned to the second interface mode is identified (a time point t4), the ZQ calibration circuit 1000 may generate a second mode end signal ES2.

Similarly, the ZQ calibration circuit 1000 may store a calibration code Code at each timing at which the first mode end signal ES1 and the second mode end signal ES2 are generated.

Figure 10:
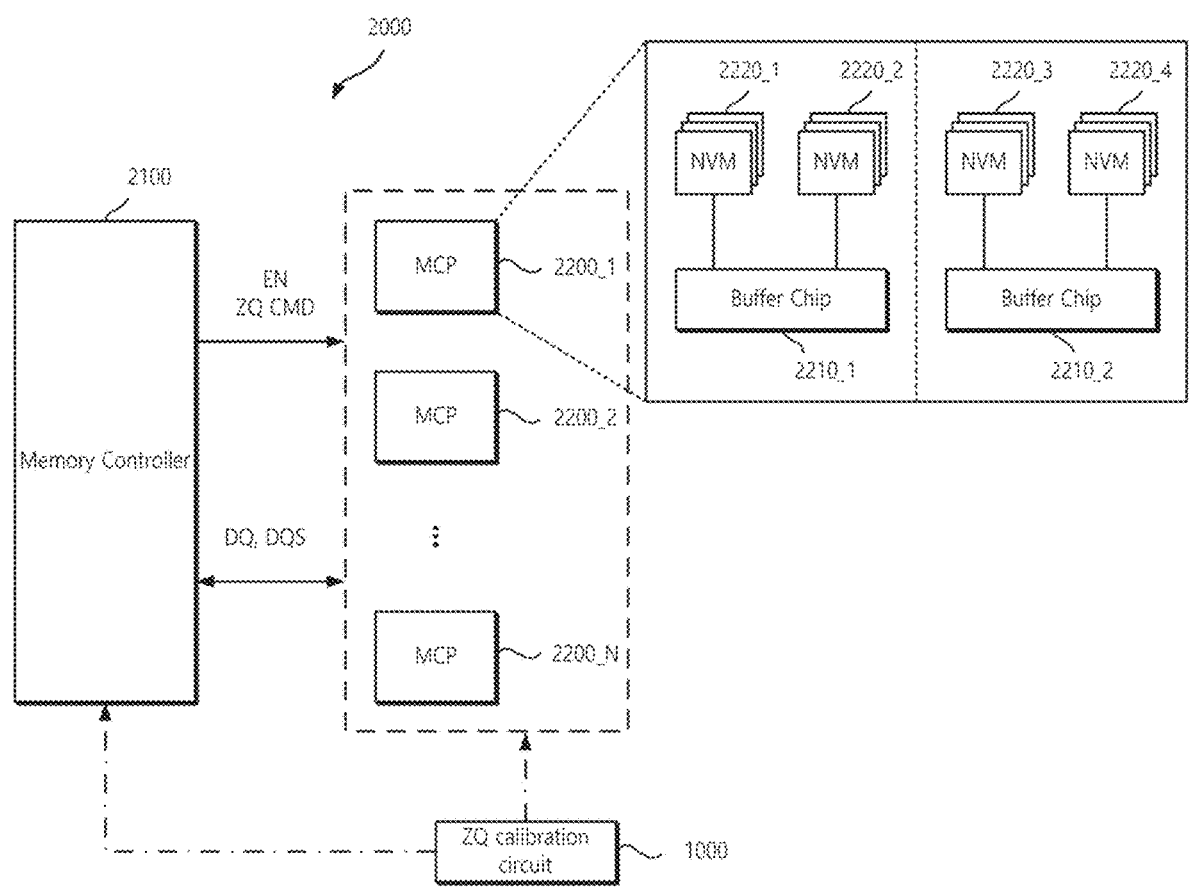
FIG. 10 is a diagram illustrating a memory device according to various example embodiments.

FIG. 10 is a diagram illustrating a memory device according to various example embodiments.

Referring to FIG. 10, a memory device 2000 may include a memory controller 2100 and a plurality of multi-chip packages (MCPs) 2200_1, 2200_2 to 2200_N.

The memory controller 2100 may be connected to the plurality of MCPs 2200_1, 2200_2 to 2200_N, and may control the plurality of MCPs 2200_1, 2200_2 to 2200_N. The memory controller 2100 transmit various enable signals, data signals DQ, strobe signals DQS, and ZQ commands ZQ CMD for controlling the plurality of MCPs 2200_1, 2200_2 to 2200_N to the plurality of MCPs 2200_1, 2200_2 to 2200_N. Alternatively or additionally, the memory controller 2100 may receive the data signal DQ and the strobe signal DQS from the plurality of MCPs 2200_1, 2200_2 to 2200_N.

Each of the plurality of MCPs 2200_1, 2200_2 to 2200_N may be implemented as packages such as one or more of PoP (Package On Package), BGA (Ball Grid Arrays), CSP (Chip Scale Package), PLCC (Plastic Leaded Chip Carrier), PDIP (Plastic Dual In-line Package), Die in Waffle Pack, Die in Wafer Form, COB (Chip On Board), CERDIP (CERamic Dual In-line Package), MQFP (Metric Quad Flat Package), TQFP (Thin Quad FlatPack), Small Outline (SOIC), SSOP (Shrink Small Outline Package), TSOP (Thin Small Outline), SIP (System In Package), MCP (2200_1, 2200_2 to 2200_N) (Multi Chip Package), WFP (Wafer-level Fabricated Package), or WSP (Wafer-level processed Stack Package).

The plurality of MCPs 2200_1, 2200_2 to 2200_N may be connected to the memory controller 2100 through different channels, respectively. Alternatively, at least some of the plurality of MCPs 2200_1, 2200_2 to 2200_N may be connected to the memory controller 2100 through the same channel.

Each of the plurality of MCPs 2200_1, 2200_2 to 2200_N may include buffer chips 2210_1 and 2210_2 and nonvolatile memories (NVMs) 2220_1, 2220_2, 2220_3, and 2220_4.

The buffer chips 2210_1 and 2210_2 may operate under the control of the memory controller 2100, and may be configured to communicate with the memory controller 2100 and the NVMs 2220_1, 2220_2, 2220_3, and 2220_4. For example, the buffer chips 2210_1 and 2210_2 may transmit signals, transmitted from the memory controller 2100, to the NVMs 2220_1, 2220_2, 2220_3, and 2220_4, and/or may transmit signals, transmitted from the NVMs 2220_1, 2220_2, 2220_3, and 2220_4, to the memory controller 2100.

At least two channels may be connected to a single buffer chip 2210_1 or 2210_2, and the plurality of NVMs 2220_1, 2220_2, 2220_3, and 2220_4 may be connected to each channel. Accordingly, the buffer chips 2210_1 and 2210_2 may reduce capacitive loading between the buffer chips 2210_1 and 2210_2 and the NVMs 2220_1 and 2220_2, 2220_3, and 2220_4.

The NVMs 2220_1, 2220_2, 2220_3, and 2220_4 may include a nonvolatile memory such as one or more of a NAND flash memory, a phase-change random access memory (PRAM), a magnetic RAM (MRAM), a ferroelectric RAM (FeRAM), a resistive RAM (RRAM), or the like.

In various example embodiments, the memory controller 2100, the buffer chips 2210_1 and 2210_2, and the NVMs 2220_1, 2220_2, 2220_3, and 2220_4 may support the ZQ calibration feature according to the above-described embodiments.

In various example embodiments, various interfaces supporting the ZQ calibration feature may be employed between the memory controller 2100 and the buffer chips 2210_1 and 2210_2, and various interfaces supporting the ZQ calibration feature may be employed between the buffer chips 2210_1 and 2210_2 and the NVMs 2220_1, 2220_2, 2220_3, and 2220_4.

In various example embodiments, an interface mode applied between the memory controller 2100 and the buffer chips 2210_1 and 2210_2 and an interface mode applied between the buffer chips 2210_1 and 2210_2 and the NVMs 2220_1, 2220_2, 2220_3, and 2220_4 may be different from each other. For example, the memory device 2000 may support a dual interface mode.

In various example embodiments, a first interface mode may be applied to the memory controller 2100 and the buffer chips 2210_1 and 2210_2, and a second interface mode may be applied to the buffer chips 2210_1 and 2210_2 and the NVMs 2220_1, 2220_2, 2220_3 and 2220_4. The memory controller 2100 may transmit a single ZQ command ZQ CMD to the buffer chips 2210_1 and 2210_2 when the ZQ calibration is required.

The memory controller 2100 and the buffer chips 2210_1 and 2210_2 may perform the ZQ calibration based on the first reference voltage Vref1 corresponding to the first interface mode. The above-described ZQ calibration circuit 1000 may be provided in one of the memory controller 2100 and the buffer chips 2210_1 and 2210_2. Of the memory controller 2100 and the buffer chips 2210_1 and 2210_2, a side provided with the ZQ calibration circuit 1000 may transmit a calibration code Code based on the ZQ calibration to a side not provided with the ZQ calibration circuit 1000, and the side not provided with the ZQ calibration circuit 1000 may similarly perform the ZQ calibration through the calibration code Code.

Then, when the end of or the completion of the first interface mode is detected through the ZQ calibration circuit 1000, the reference voltage may change from a first reference voltage Vref1 to a second reference voltage Vref2. In this case, the buffer chips 2210_1 and 2210_2 and the NVMs 2220_1, 2220_2, 2220_3, and 2220_4 may perform the ZQ calibration based on the second reference voltage Vref2. Similarly, the above-described ZQ calibration circuit 1000 may be provided in one of the buffer chips 2210_1 and 2210_2 and the NVMs 2220_1, 2220_2, 2220_3, and 2220_4.

The ZQ calibration for both the first interface mode and the second interface mode may be performed during a single unit ZQ time tZQ based on the ZQ command ZQ CMD issued by the memory controller 2100.

According to various example embodiments, the memory device 2000 may perform ZQ calibration for each interface mode during a single ZQ command ZQ CMD and a single unit ZQ time tZQ when a plurality of different interface modes are supported. Accordingly, an additional ZQ command ZQ CMD or an additional ZQ time tZQ may not be required even when a number of interface modes is increased.

In various example embodiments, the memory device 2000 may support a training function even in a heavy load system. For example, duty cycle correction (DCC) training may be a function for compensating for duty cycle mismatch of a red enable signal. Read/write DQ training (hereinafter referred to "read training" or "write training") may be a function of a host for aligning DQS and DQ signal DQ caused by a mismatched DQS path. For example, the DCC training and the read/write training may be supported in an operation of 800 Mbps or more. In addition, the above-described training functions may be sequentially performed after the ZQ calibration according to the above-described embodiments is performed.

In various example embodiments, when the first interface is set to be an initial interface, the first interface may perform training. A side of the memory controller 2100 may perform ZQ calibration in the first interface mode, and then sides of the NVMs 2220_1, 2220_2, 2220_3, and 2220_4 may also perform the ZQ calibration. The ZQ calibration may be performed together with the above-described buffer chips 2210_1 and 2210_2. Then, the sides of the NVMs 2220_1, 2220_2, 2220_3, and 2220_4 may perform DCC training. Then, read/write training may be performed.

In various example embodiments, the second interface may perform training. A side of the memory controller 2100 may activate the second interfaced and may perform ZQ calibration in the second interface mode. Then, the sides of the NVMs 2220_1, 2220_2, 2220_3, and 2220_4 may also perform the ZQ calibration. The ZQ calibration may be performed together with the above-described buffer chips 2210_1 and 2210_2. When the ZQ calibration is performed, the sides of the NVMs 2220_1, 2220_2, 2220_3, and 2220_4 may perform DCC training. Then, read/write training may be performed. For example, a read training sequence for read training may be used by the memory controller 2100, and a write training sequence for write training may be used by the memory controller 2100.

ZQ calibration in each interface mode may be performed through the ZQ calibration circuit 1000 according to various example embodiments. For example, the ZQ calibration circuit 1000 may an end of the first interface mode when the first interface mode comes to an end (for example, ZQ calibration for the first interface mode is successfully performed). In this case, the memory controller 2100 may activate the second interface and ZQ calibration for the second interface mode may be performed.

Figure 11:
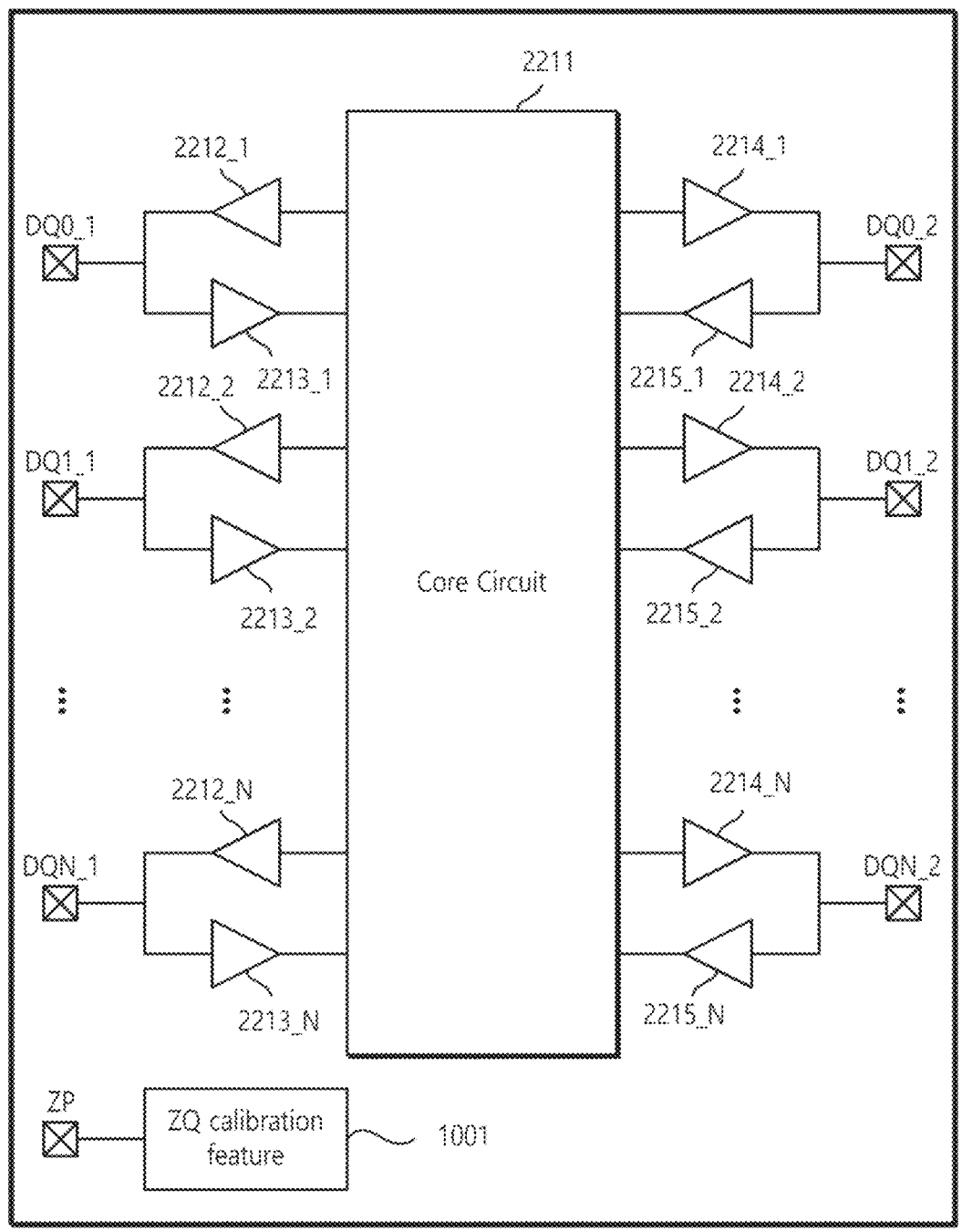
FIG. 11 is a diagram illustrating an example of a buffer chip in FIG. 10.

FIG. 11 is a diagram illustrating an example of a buffer chip in FIG. 10.

Referring to FIG. 11, the buffer chips 2210_1 and 2210_2 according to various example embodiments may include a core circuit 2211, a plurality of first DQ pads DQ0_1, DQ1_1 to DQN_1, a plurality of second DQ pads DQ0_2, DQ1_2 to DQN_2, a ZQ pad ZP, a plurality of first drivers 2212_1, 2212_2 to 2212_N, a plurality of first receivers 2213_1, 2213_2 to 2213_N, a plurality of second drivers 2214_1, 2214_2 to 2214_N, and a plurality of second receivers 2215_1, 2215_2 to 2215_N.

The core circuit 2211 may control the overall operation of the buffer chips 2210_1 and 2210_2. For example, the core circuit 2211 may transmit a signal, transmitted from the memory controller 2100 through the plurality of first receivers 2213_1, 2213_2 to 2213_N, to the plurality of second drivers 2214_1, 2214_2 to 2214_N, or may transmit a signal, transmitted from NVMs 2220_1, 2220_2, 2220_3, and 2220_4 through the plurality of second receivers 2215_1, 2215_2 to 2215_N, to the plurality of first drivers 2212_1, 2212_2 to 2212_N.

The plurality of first drivers 2212_1, 2212_2 to 2212_N and the plurality of first receivers 2213_1, 2213_2 to 2213_N may be referred to as a controller stage.

The plurality of first drivers 2212_1, 2212_2 to 2212_N may be connected to the plurality of first DQ pads DQ0_1, DQ1_1 to DQN_1 and the core circuit 2211, respectively. The plurality of first drivers 2212_1, 2212_2 to 2212_N may transmit a signal, received from the core circuit 2211, to the memory controller 2100 through the plurality of first DQ pads DQ0_1, DQ1_1 to DQN_1.

The plurality of first drivers 2212_1, 2212_2 to 2212_N may correspond to the ZQ driver 1300 according to the above-described embodiments. In various example embodiments, when a ZQ calibration feature may be performed for each of various interface modes through the ZQ pad ZP, the plurality of first drivers 2212_1, 2212_2 to 2212_N may adjust termination resistance based on a calibration code Code generated for each interface mode, and may adjust driver strengths.

The plurality of first drivers 2212_1, 2212_2 to 2212_N may receive the signal transmitted from the memory controller 2100, and may transmit the received signal to the core circuit 2211.

The plurality of second drivers 2214_1, 2214_2 to 2214_N and the plurality of second receivers 2215_1, 2215_2 to 2215_N may be referred to as a memory stage.

The plurality of second drivers 2214_1, 2214_2 to 2214_N may be connected to the plurality of second DQ pads DQ0_2, DQ1_2 to DQN_2 and the core circuit 2211, respectively. The plurality of second drivers 2214_1, 2214_2 to 2214_N may transmit a signal, received from the core circuit 2211, to the NVMs 2220_1, 2220_2, 2220_3, and 2220_4 through the plurality of second DQ pads DQ0_2, DQ1_2 to DQN_2.

Similarly, the plurality of second drivers 2214_1, 2214_2 to 2214_N may correspond to the ZQ driver 1300 according to the above-described embodiments. In various example embodiments, when a ZQ calibration feature 1001 is performed for each of various interface modes through the ZQ pad ZP, the plurality of second drivers 2214_1, 2214_2 to 2214_N may adjust termination resistance based on the calibration code Code generated for each interface mode, or may adjust driver strengths.

The plurality of second drivers 2214_1, 2214_2 to 2214_N may receive a signal transmitted from the memory controller 2100, and may transmit the received signal to the core circuit 2211.

The buffer chips 2210_1 and 2210_2 may perform the ZQ calibration feature 1001 in the controller stage or the memory stage. For example, the buffer chips 2210_1 and 2210_2 may perform ZQ calibration for a current interface mode of the controller stage or the memory stage, and may detect an end of the ZQ calibration for the current interface mode when the current interface mode comes to an end. The buffer chips 2210_1 and 2210_2 may change a reference voltage to a reference voltage corresponding to another interface mode when detecting the end of the current interface mode, and may perform ZQ calibration based on the changed reference voltage.

FIG. 12 is a flowchart illustrating a method of operating a memory device according to various example embodiments.

Referring to FIG. 12, in various example embodiments, in operation S1110, the memory device may receive a ZQ command.

In operation S1120, the memory device may perform ZQ calibration based on a first reference voltage.

In operation S1130, the memory device may repeatedly perform operation S1120 until a ZQ level, for example, an output of a ZQ driver is dithered to the first reference voltage.

In operation S1140, when the output of the ZQ driver is dithered to the first reference voltage in operation S1130, the memory device may detect that a single interface mode comes to an end, and may generate a mode end signal ES.

In operation S1150, the memory device may perform ZQ calibration based on a second reference voltage generated by changing the first reference voltage.

In operation S1160, the memory device may repeatedly perform operation S1150 until the ZQ level, for example, the output of the ZQ driver is dithered to the second reference voltage.

In operation S1170, when the output of the ZQ driver is dithered to the second reference voltage in operation S1160, the memory device detect that another interface mode comes to an end, and may generate a mode end signal ES.

As set forth above, according to example embodiments, a ZQ calibration circuit for providing a ZQ calibration feature in multiple interfaces may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been shown and described above, it will be apparent to those of ordinary skill in the art that modifications and variations could be made without departing from the scope of the present inventive concept as defined by the appended claims. Additionally, example embodiments are not necessarily mutually exclusive with one another. For example, some example embodiments may include one or more features described with reference to one or more figures, and may also include one or more other features described with reference to one or more other figures.

What is claimed is:

1. A ZQ calibration circuit comprising:
   a ZQ controller configured to detect an end of one interface mode from among a plurality of interface modes in which ZQ calibration is supported, and to instruct a switch to another interface mode in response to the one interface mode coming to an end;
   a ZQ engine configured to generate a first reference voltage corresponding to the one interface mode through a multi-reference voltage generator, to generate a second reference voltage corresponding to the another interface mode in response to the switch to the another interface mode being instructed, to perform the ZQ calibration based on the first reference voltage or the second reference voltage, and to output a calibration code; and
   a ZQ driver configured to output an output signal through an input/output pad based on the calibration code.

2. The ZQ calibration circuit of claim 1, wherein
   the ZQ engine is configured to perform the ZQ calibration for the plurality of interface modes during a single unit of ZQ time.

3. The ZQ calibration circuit of claim 1, wherein
   the plurality of interface modes comprise a first interface mode in which a common level of swing of the output signal corresponds to half of an input/output voltage, and a second interface mode in which a minimum point of the swing of the output signal corresponds to a ground voltage.

4. The ZQ calibration circuit of claim 1, wherein
   the ZQ engine is configured to generate a flag signal in response to the one interface mode coming to an end, and
   the ZQ controller is configured to detect that the one interface mode comes to an end, in response to receiving the flag signal.

5. The ZQ calibration circuit of claim 1, wherein
   the ZQ engine further comprises:
   a comparator connected to a ZQ pad and configured to receive at least one of the first reference voltage or the second reference voltage from the multi-reference voltage generator, to compare the first reference voltage or the second reference voltage with a voltage of the ZQ pad, and to output a result of the comparison; and
   a counter configured to output the calibration code based on the result of the comparison.

6. The ZQ calibration circuit of claim 5, wherein
   the counter is configured to generate a flag signal in response to the one interface mode or the another interface mode coming to an end, and to transmit the calibration code at a time of the end to the ZQ controller.

7. The ZQ calibration circuit of claim 1, wherein the ZQ controller comprises:
a mode end detector configured to detect the end of the one interface mode and to output a mode end signal;
a mode switcher configured to output a mode switch signal to the ZQ engine when receiving the mode end signal; and
a register configured to store the mode end signal and the calibration code.

8. The ZQ calibration circuit of claim 7, wherein the mode end detector is configured to output the mode end signal in response to the output signal swings within a specific range with respect to the first reference voltage or the second reference voltage.

9. The ZQ calibration circuit of claim 7, wherein the register is configured to store the calibration code corresponding to a time point at which the mode end signal is output.

10. The ZQ calibration circuit of claim 9, wherein the register is configured to store the calibration code corresponding to a time point at which a ZQ enable signal for the ZQ calibration is terminated.

11. The ZQ calibration circuit of claim 7, wherein the mode switcher is configured to generate a reset signal for resetting at least a portion of an operation of the ZQ controller and an operation of the ZQ engine in response to receiving the mode end signal.

12. The ZQ calibration circuit of claim 11, wherein the at least a portion of the ZQ controller and the operation of the ZQ engine are configured to reset based on the reset signal, in a state in which a ZQ enable signal for the ZQ calibration is maintained.

13. A ZQ calibration method of a ZQ calibration circuit, the ZQ calibration method comprising:
performing ZQ calibration based on a first reference voltage in one interface mode from among a plurality of interface modes in which the ZQ calibration is supported;
detecting an end of the one interface mode;
instructing a switch to another interface mode in response to the one interface mode coming to an end;
generating a second reference voltage corresponding to the another interface mode in response to the switch to the another interface mode being instructed;
performing the ZQ calibration based on the second reference voltage and outputting a calibration code; and
outputting an output signal through an input/output pad based on the calibration code.

14. The ZQ calibration method of claim 13, further comprising:
receiving a ZQ command indicating the ZQ calibration, wherein the ZQ calibration for the one interface mode and the ZQ calibration for the another interface mode are performed together during a ZQ time based on the ZQ command.

15. The ZQ calibration method of claim 13, wherein the one interface mode is detected to come to an end in response to the output signal swinging within a first range with respect to the first reference voltage.

16. The ZQ calibration method of claim 13, further comprising:
receiving a flag signal after the ZQ calibration for the one interface mode comes to an end,
wherein
the one interface mode is detected to come to an end in response to the flag signal being received.

17. The ZQ calibration method of claim 13, further comprising:
generating a first mode end signal in response to the end of the one interface mode being detected; and
storing the calibration code corresponding to a time point at which the first mode end signal is generated.

18. A memory device comprising:
a memory controller;
a buffer chip configured to operate under control of the memory controller; and
a nonvolatile memory connected to the buffer chip,
wherein
the memory controller, the buffer chip, and the nonvolatile memory are configured to operate in a plurality of interface modes in which ZQ calibration is supported, and
the ZQ calibration is configured to be performed based on a first reference voltage in one interface mode, among the plurality of interface modes, and comprises instructing a switch to another interface mode in response to the one interface mode coming to an end, generating a second reference voltage corresponding to the another interface mode in response to the switch to the another interface mode being instructed, performing the ZQ calibration based on the second reference voltage, outputting a calibration code, and outputting an output signal through an input/output pad based on the calibration code.

19. The memory device of claim 18, wherein the ZQ calibration is configured to be performed on the plurality of interface modes during a single unit ZQ time.

20. The memory device of claim 18, wherein the plurality of interface modes comprise a first interface mode in which a common level of swing of the output signal corresponds to half of an input/output voltage, and a second interface mode in which a minimum point of the swing of the output signal corresponds to a ground voltage.

* * * * *